(12) United States Patent
Fenouillet-Beranger et al.

(10) Patent No.: US 9,761,583 B2
(45) Date of Patent: Sep. 12, 2017

(54) MANUFACTURING OF SELF ALIGNED INTERCONNECTION ELEMENTS FOR 3D INTEGRATED CIRCUITS

(71) Applicant: COMMISSARIAT A L'ENERGIE ATOMIQUE ET AUX ENERGIES ALTERNATIVES, Paris (FR)

(72) Inventors: Claire Fenouillet-Beranger, Voiron (FR); Bernard Previtali, Grenoble (FR); Olivier Rozeau, Moirans (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/176,716

(22) Filed: Jun. 8, 2016

(65) Prior Publication Data
US 2016/0365342 A1    Dec. 15, 2016

(30) Foreign Application Priority Data

Jun. 9, 2015 (FR) ...................................... 15 55237

(51) Int. Cl.
*H01L 21/00* (2006.01)
*H01L 27/06* (2006.01)
(Continued)

(52) U.S. Cl.
CPC .... *H01L 27/0688* (2013.01); *H01L 21/31111* (2013.01); *H01L 21/31144* (2013.01);
(Continued)

(58) Field of Classification Search
CPC ......... H01L 27/0688; H01L 21/823437; H01L 21/823475; H01L 21/31144;
(Continued)

(56) References Cited

U.S. PATENT DOCUMENTS 6,040,223 A    3/2000 Liu et al.
6,433,609 B1   8/2002 Voldman
(Continued)

FOREIGN PATENT DOCUMENTS

EP    0 075 945 A2    4/1983
FR    2 986 370 A1    8/2013
(Continued)

OTHER PUBLICATIONS

French Preliminary Search Report issued Feb. 5, 2016 in French Application 15 55237 filed on Jun. 9, 2015 (with English Translation of Categories of Cited Documents).

*Primary Examiner* — Xinning Niu
*Assistant Examiner* — Vu A Vu
(74) *Attorney, Agent, or Firm* — Oblon, McClelland, Maier & Neustadt, L.L.P.

(57) ABSTRACT

A method for making connection elements between two different levels of components in a 3D integrated circuit, including: forming a lateral insulating area supported on at least one given conducting area among several interconnection areas on a first level of components, the insulating area extending around a semiconducting layer on a second level in which at least one transistor can be formed; removing a first portion of the lateral insulating area so as to form at least one hole exposing said given conducting area; and depositing a conducting material in the hole so as to form a first electrical connection element between the second component and the given conducting area.

14 Claims, 15 Drawing Sheets

(51) Int. Cl.
*H01L 21/822* (2006.01)
*H01L 21/8234* (2006.01)
*H01L 21/311* (2006.01)
*H01L 21/768* (2006.01)
*H01L 21/84* (2006.01)
*H01L 29/66* (2006.01)

(52) U.S. Cl.
CPC .. *H01L 21/76802* (2013.01); *H01L 21/76877* (2013.01); *H01L 21/8221* (2013.01); *H01L 21/823418* (2013.01); *H01L 21/823437* (2013.01); *H01L 21/823475* (2013.01); *H01L 21/84* (2013.01); *H01L 29/66545* (2013.01)

(58) Field of Classification Search
CPC ......... H01L 21/76877; H01L 21/76802; H01L 21/31111; H01L 21/84; H01L 29/66545; H01L 21/823418
USPC ....................................................... 438/151
See application file for complete search history.

(56) References Cited

U.S. PATENT DOCUMENTS

| | | | |
|---|---|---|---|
| 7,291,550 B2* | 11/2007 | Kim | H01L 21/02063 |
| | | | 257/E21.226 |
| 7,602,028 B2* | 10/2009 | Son | H01L 21/8221 |
| | | | 257/390 |
| 8,441,104 B1* | 5/2013 | Hu | H01L 29/0646 |
| | | | 257/173 |
| 8,722,471 B2 | 5/2014 | Batude et al. | |
| 9,018,078 B2 | 4/2015 | Sklenard et al. | |
| 2012/0256238 A1 | 10/2012 | Ning et al. | |
| 2014/0306273 A1* | 10/2014 | Ho | H01L 21/28088 |
| | | | 257/288 |

FOREIGN PATENT DOCUMENTS

FR 2 986 371 A1 8/2013
WO WO 2014/209278 A1 12/2014

\* cited by examiner

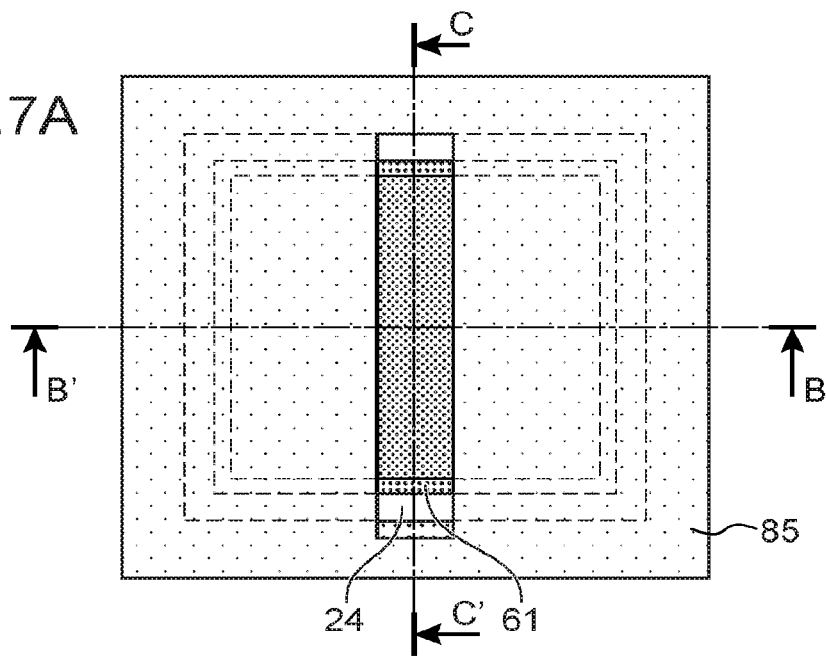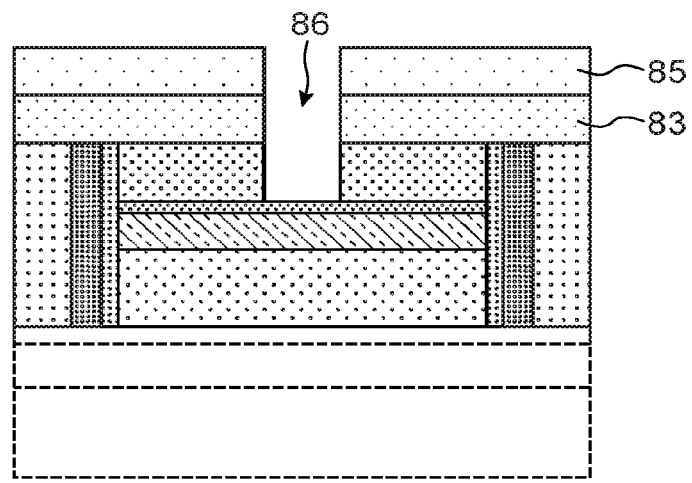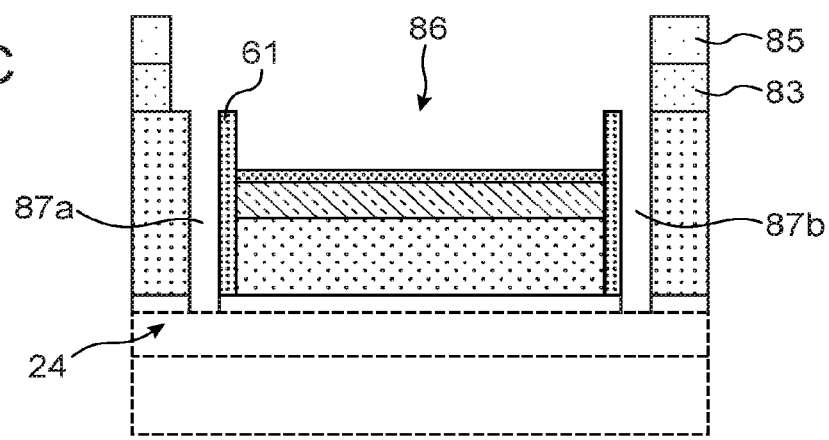

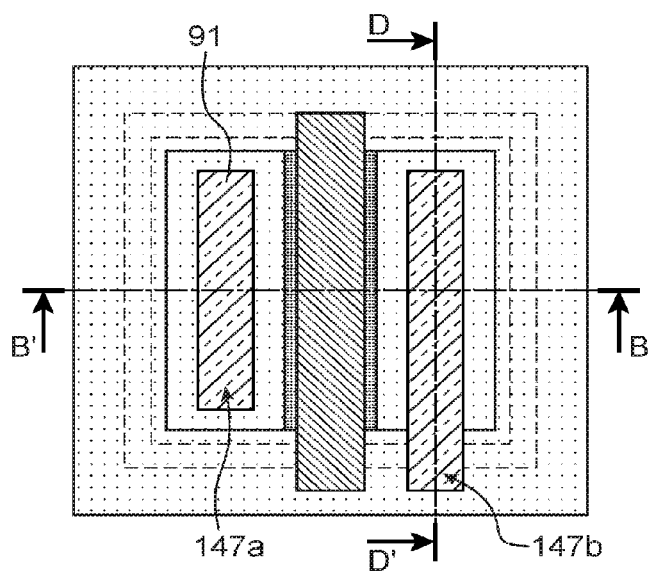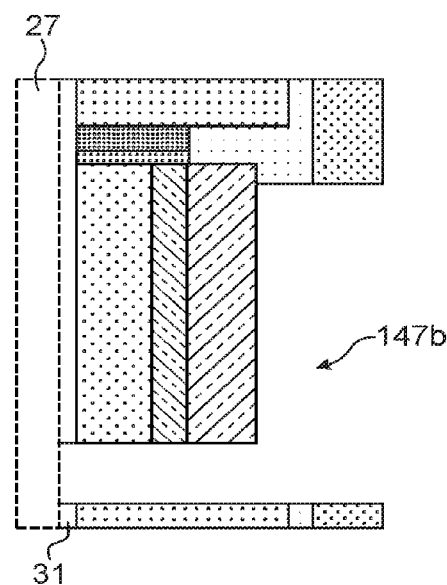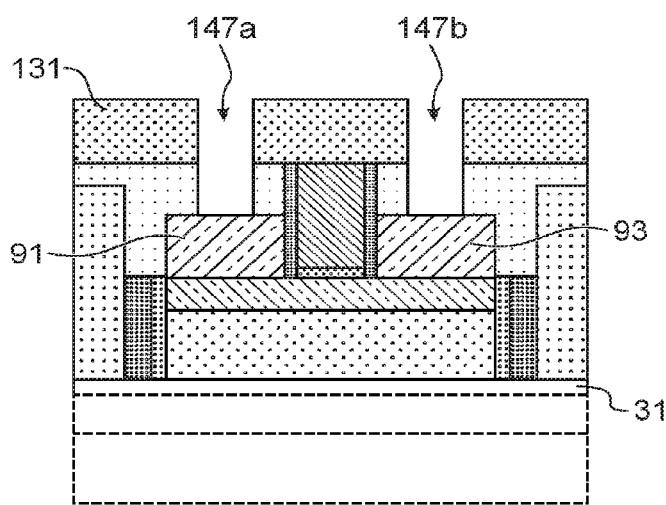
FIG.12A
FIG.12C
FIG.12B

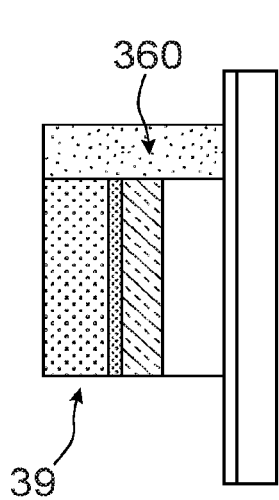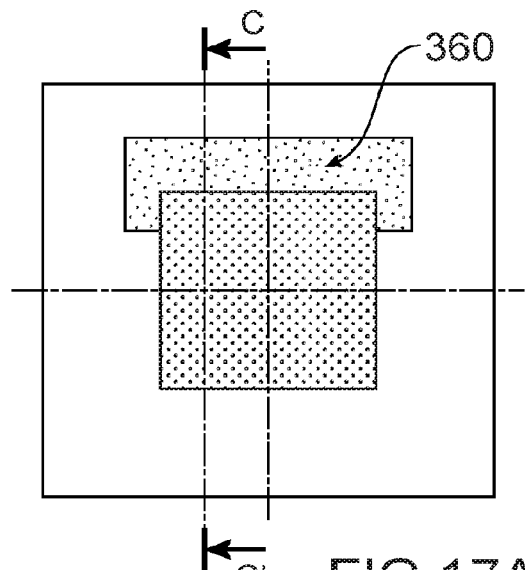
FIG. 17B　　FIG. 17A
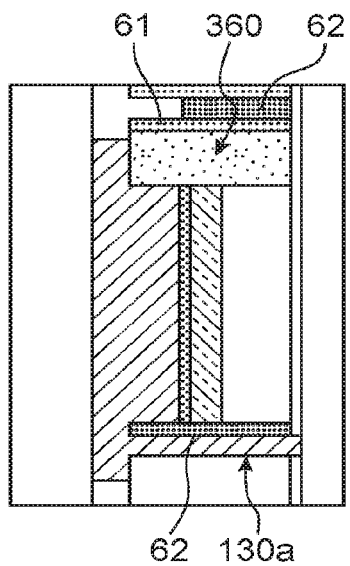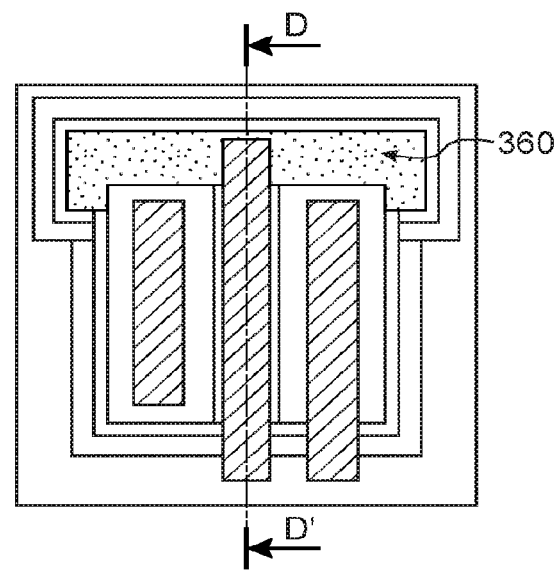
FIG. 18B　　FIG. 18A

MANUFACTURING OF SELF ALIGNED INTERCONNECTION ELEMENTS FOR 3D INTEGRATED CIRCUITS

TECHNICAL DOMAIN

This application relates to the domain of integrated circuits provided with components distributed on several levels, and particularly superposed transistors. Such devices are usually qualified as 3 dimensional or "3D" integrated circuits.

This application applies more particularly to manufacturing of connection elements between a transistor on a given level and an element on a lower level.

PRIOR ART

In general, continuous efforts are being made to increase the density of transistors in the field of integrated circuits.

One solution to achieve this is to distribute the transistors on several superposed semiconducting layer levels. Such circuits thus usually comprise at least two superposed semiconducting layers separate from each other by an insulating layer.

Interconnection elements passing through this insulating layer may be provided to connect the different transistor levels to each other.

The dimensions and the distribution of interconnection elements between the various component levels creates problems.

In order to make an interconnection between an electrode, for example the gate electrode of a transistor on a given level and an element on a level lower than this given level, it is known that a contact structure can be provided that rises to a metallic level, extends horizontally in this metallic level, and then goes down again to the lower level.

There are dimensional problems with this structure, and alignment defects between different component levels usually have to be taken into account when making this structure.

The problem arises of finding a new method for making an improved interconnection element for a 3D integrated circuit to overcome the disadvantages mentioned above.

PRESENTATION OF THE INVENTION

One embodiment of this invention allows for a method for manufacturing at least one interconnection element between different component levels in an integrated circuit provided with several superposed levels of electronic components, the method including the following steps:

a) form at least one block comprising a second semiconducting layer in which at least one channel region of at least one transistor in an upper level can be at least partially formed and an insulating layer can be formed between the first semiconducting layer and the second semiconducting layer, on a lower level provided with one or several connection areas and at least one first component made at least partially in a first semiconducting layer;

b) form a lateral insulating area in contact with at least one lateral face of the block, the lateral insulating area being located facing a first connection area on the lower level;

c) remove at least one portion of the lateral insulating area so as to form at least one hole, the bottom of which exposes said first connection area;

d) fill the hole with a conducting material, the conducting material being placed so as to form at least one interconnection element between an electrode of the upper transistor and said first low level connection area.

In step a), said lateral face of the block is advantageously arranged according to the position of a first connection area of the lower level.

Thus, the lateral insulating area made in step b) is formed on this face and is arranged depending on the position of the first connection area, so that a self-aligned interconnection element can be made afterwards, that is very close to the active area of the upper level transistor, without any additional mask being necessary.

The lateral insulating area may be formed in step b) so as to entirely surround the block.

Such a method can be used to form an interconnection element composed only of a part that extends in contact with the lateral face of the block and possibly another part that extends facing the second semiconducting layer and parallel to it, without it being necessary to pass through a metal upper stage to make electrical contact.

The block made in step a) may be formed by etching a stack of layers.

According to a first possible embodiment, the electrode is a transistor gate electrode.

The lateral insulating area may advantageously comprise a first dielectric layer based on a first dielectric material and a second dielectric layer based on a second dielectric material that can be selectively etched relative to the first dielectric material.

The first dielectric layer may be arranged in contact with the second semiconducting layer and may be coated with the second dielectric layer.

In this case, the first portion of the lateral insulating area removed in step c) is a portion of the second dielectric layer selectively etched relative to the first dielectric layer such that the first dielectric material is kept between the hole and the second semiconducting layer.

This makes it possible to form an interconnection element with the gate electrode while keeping insulation between this interconnection element and the second semiconducting layer. This thus avoids any short circuit between the interconnection element and the active area of the upper level transistor.

A protective layer may be arranged on the lower level before formation of the block in step a). When the lateral insulating area is formed from a first dielectric material and a second dielectric material that can be selectively etched relative to the first dielectric material, the protective layer may advantageously be formed from a stack of materials similar to the stack of materials in the lateral insulating area.

The method may also comprise steps to:

form at least one other hole by etching at least one other portion of the lateral insulating area, the other hole being arranged so as to expose an area on the second semiconducting layer that will form a source or drain region, and at least one second connection area on the first level;

fill the other hole with a conducting material so as to form at least one other interconnection element between a source or drain electrode of the transistor and a second connection area on the first level.

Thus, a self-aligned interconnection element is made between the lower level and the gate of the transistor in the upper level and another self-aligned interconnection element between the lower level and the source or drain of this transistor.

The first connection area and the second connection area may be distinct and not connected to each other.

According to one possible embodiment of the method, at least one masking layer is also formed facing the second semiconducting layer and at least one opening is formed in the masking layer, the opening using a gate pattern, the first hole being made in step c) so as to communicate with the opening, the deposit in step d) including filling of said opening by a conducting material so as to form a transistor gate.

The gate can thus be made at the same time as the interconnection element between the gate electrode and the first connection area.

The block formed in step a) may include a gate dielectric layer located on the second semiconducting layer, the opening exposing the gate dielectric layer.

This can thus eliminate the deposition of a gate dielectric in the opening before the filling step d). This makes it possible to maintain the integrity of the dielectric.

When the lateral insulating area is composed of a stack of a first dielectric layer and a second dielectric layer, the masking layer may be provided in contact with the second dielectric layer and based on the second dielectric material.

This makes it possible to make the opening and the hole using the same etching or at least one same etching method.

Advantageously, after the lateral insulating area has been formed, the method may include steps to:
  form a sacrificial gate based on a sacrificial material, on the second semiconducting layer and then
  grow source and drain regions on the semiconducting layer, then
  replace the sacrificial gate by another gate, the other gate being formed in step d) based on said conducting material.

In this case, when the sacrificial material is not metallic, for example when it is a semiconducting material, contamination of the upper level can be prevented particularly during growth of the source and drain regions.

According to one possible embodiment, it is possible to provide an additional conducting ground plane layer or a layer to control the threshold voltage of the upper level transistor from the back.

In this case, the block may comprise a conducting layer between the upper level and the second semiconducting layer, the conducting layer being coated with the insulating layer, and being also arranged facing the second semiconducting layer such that the insulating layer separates the second semiconducting layer from this conducting layer, the insulating layer having a thickness and being based on a material selected so as to enable capacitive coupling between the conducting layer and the second semiconducting layer.

Thus, the conducting layer can control the threshold voltage of said transistor by capacitive coupling depending on the manner in which it is biased. This conducting layer may be a doped semiconducting layer.

Such an arrangement may be used particularly when the upper level transistor is made using the FDSOI (<<Fully-Depleted Silicon On Insulator>>) technology.

The conducting layer may also be arranged so as to project from the second semiconducting layer, in the block, so as to form an offset. This can make it easier to make contact.

According to a second possible embodiment of the method in which the electrode is a transistor source electrode or drain electrode, the portion being removed in step c) so as to expose an area of the second semiconducting layer that will form a source or drain region.

According to one particular embodiment, the method may also include a step between step a) and step b) to form an insulating plug in contact with at least one other lateral face of the block, the lateral face not being covered by the insulating plug.

One embodiment of the represent invention includes an integrated circuit provided with several levels of superposed electronic components, comprising:
  a lower level with at least one first component at least partially formed in a first semiconducting layer;
  a block arranged on the lower level comprising a second semiconducting layer in which at least one channel region of at least one transistor on a second level is formed and an insulating layer is formed between the first semiconducting layer and the second semiconducting layer;
  an interconnection element between the gate of the upper transistor and a lower level connection area, the interconnection element being formed from a conducting material extending in contact with a lateral face of the block, the conducting material extending on a gate dielectric area parallel to the second semiconducting layer.

BRIEF DESCRIPTION OF THE DRAWINGS

This invention will be better understood after reading the description of example embodiments given purely for information and that are in no way limitative, with reference to the appended drawings on which:

FIGS. 1, 2, 3A-3B, 4A-4B, 5A-5B, 6A-6B, 7A-7C, 8A-8C, 9A-9B, 10A-10C, 11A-11C, 12A-12C, 13A-13D illustrate an example method of making an interconnection element between two levels of components in a 3D integrated circuit;

FIGS. 17A, 17B, 18A, 18B show another variant embodiment of the method according to the invention;

Identical, similar or equivalent parts of the different figures have the same numeric references to facilitate comparison between these figures.

The different parts shown in the figures are not necessarily all at the same scale, to make the figures more easily understandable.

Furthermore, in the following description, terms that depend on the orientation of the structure such as <<on>>, <<above>>, <<vertically>>, <<lateral>>, <<side>>, <<upper>> are applicable assuming that the structure is oriented as shown in the figures.

DETAILED PRESENTATION OF PARTICULAR EMBODIMENTS

An example method of making connection elements for a 3 dimensional or "3D" integrated circuit will be given below.

The device can be made from a substrate comprising a first surface semiconducting layer 11 in which there are one or several components on a first level $N_1$ of electronic components.

Figure 1:
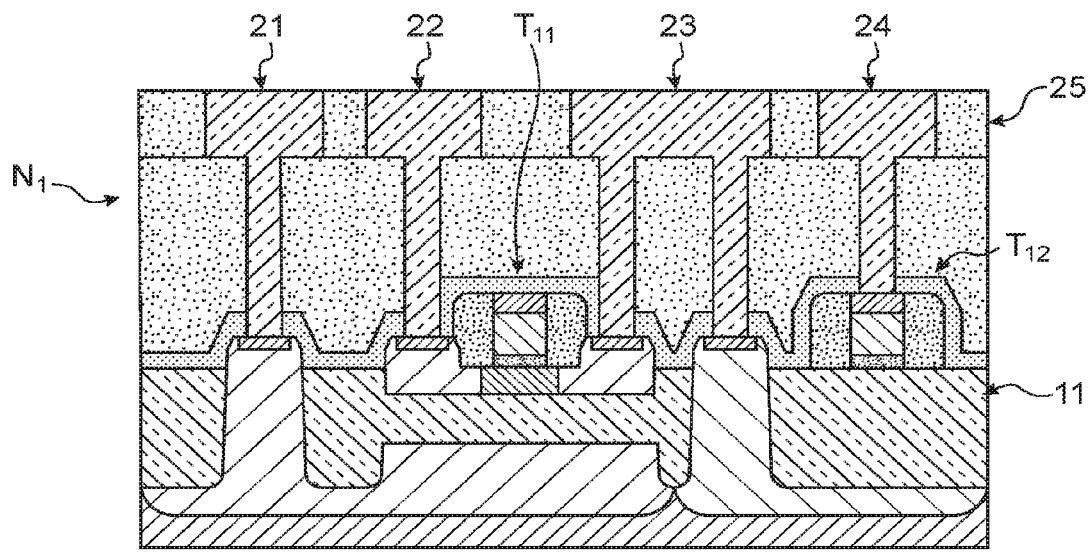

In the example shown in FIG. 1, the components are transistors $T_{11}$ and $T_{12}$, particularly MOS (<<Metal Oxide Semi-conductor>>) type transistors, and each transistor has channel regions that extend in the first semiconducting layer 11.

One or several connecting conducting layers 21, 22, 23, 24 belonging to the first level $N_1$ are also formed above transistors $T_{11}$, $T_{12}$ and are connected to them. The connection areas 21, 22, 23, 24 are formed in a layer 25 based on a dielectric material.

This material may be of the type commonly called <<low-k>>, in other words a dielectric material for example such as SiOC with a low dielectric constant.

Figure 2:
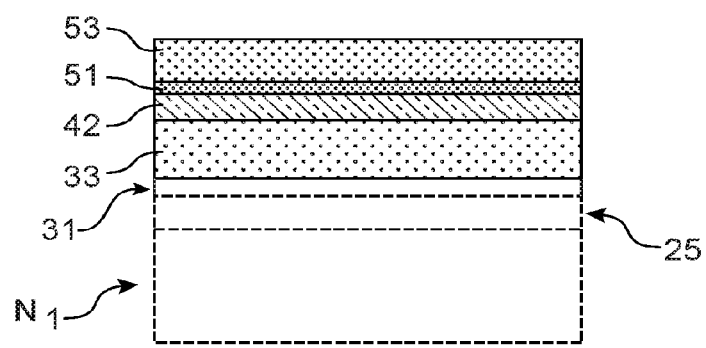

After the first level $N_1$ of components has been formed, a stack of layers is made on this first level $N_1$ that covers one or several connection areas 21, 22, 23, 24. The stack of layers formed on the first level is thus placed facing one or several given connection areas on the first level $N_1$. In FIG. 2, the first level $N_1$ and the insulating layer 25 in which the connection areas are located are shown diagrammatically by discontinuous lines.

The stack made may include a thin protective layer 31 designed to protect the connection areas of the first interconnection level during one or more subsequent etching steps. The thin protective layer 31 may be formed from a stack of several different dielectric materials for example a two-layer stack of SiN and $SiO_2$.

An insulating layer 33 is formed on the thin protective layer 31 above the first level $N_1$ of components. The insulating layer 33 is located between the first semiconducting layer 11 and a second semiconducting layer 42 in which one or several components of a second level $N_2$ of electronic components will be made. The insulating layer 33 is thus configured to form insulation between the first level $N_1$ and the second level $N_2$ of components.

In this example embodiment, at least one transistor is provided in the second level $N_2$ of components. This transistor may for example be of the MOS (Metal Oxide Semi-conductor) type, with a channel region provided in the second semiconducting layer 42.

One method of forming the second semiconducting layer 42 may consist of making a transfer, for example using a molecular bonding technique, in which a support including the second semiconducting layer 42 is transferred onto the insulating layer 33. This support itself may be provided with an insulating layer, for example based on silicon oxide ($SiO_2$), that is then put into contact with the insulating layer 33 to make an oxide-oxide type bond. According to one variant, the second semiconducting layer 42 can be transferred directly onto the insulating layer 33 by molecular bonding. The semiconducting layer 42 is coated with a gate dielectric layer 51 that may be made of a <<high-k>> material for example such as $HfO_2$.

The gate dielectric layer 51 may also be coated with a first masking layer 53 for example based on silicon nitride.

A block 39 is then formed by etching the stack protected by the first masking layer 53.

Thus, an active area is defined in the second semiconducting layer 42 that can collect one or several transistor channel regions. The stack may for example be etched using a dry etching method. It will then be possible to use the protective layer 31 as an etching stop layer.

Figure 3A:
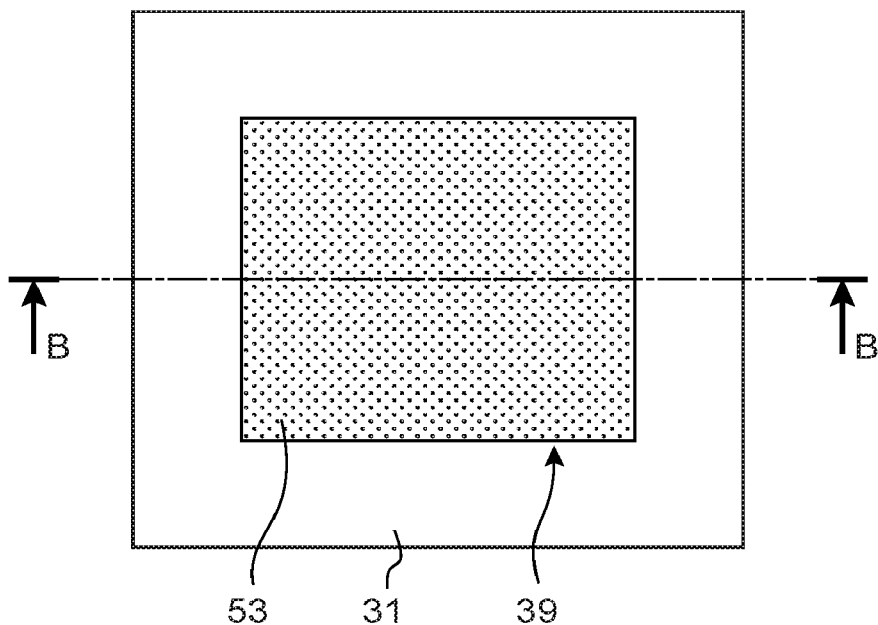
Figure 3B:
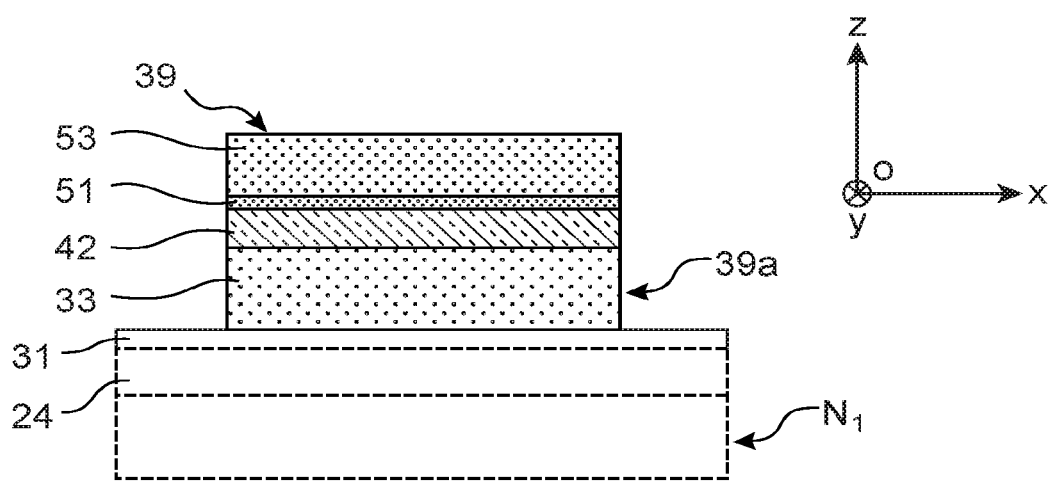

FIG. 3A shows a top view of the block 39 formed in the stack after etching as far as the protective layer 31, and FIG. 3B shows a sectional view of this block 39 along a line B'B.

The block 39 is provided with lateral faces 39a that, in this example embodiment, have a direction parallel to a normal to the main plane of the second semiconducting layer, the main plane being defined here and throughout the remainder of the description as being a plane passing through the second semiconducting layer and parallel to the [O, x, y] plane in the [0; x; y; z] orthogonal coordinate system shown in FIG. 3B, the normal being parallel to the z axis of this coordinate system. The position of at least one lateral face 39a of the block 39 is determined as a function of the position of one or several connection areas on the first level $N_1$. In the example in FIG. 3B, a lateral face 39a is vertically aligned with the connection area 24 on the first level $N_1$.

The next step is to make a so-called "lateral" insulating area 60 that extends parallel to at least the lateral face 39a of the block 39. According to one possible embodiment shown in FIGS. 4A-4B and 5A-5B, this insulating area 60 may be made entirely around the block 39 so as to completely surround it. The insulating area 60 will be used to make at least one self-aligned connection element and can be formed from several thicknesses of different dielectric materials.

Figure 4A:
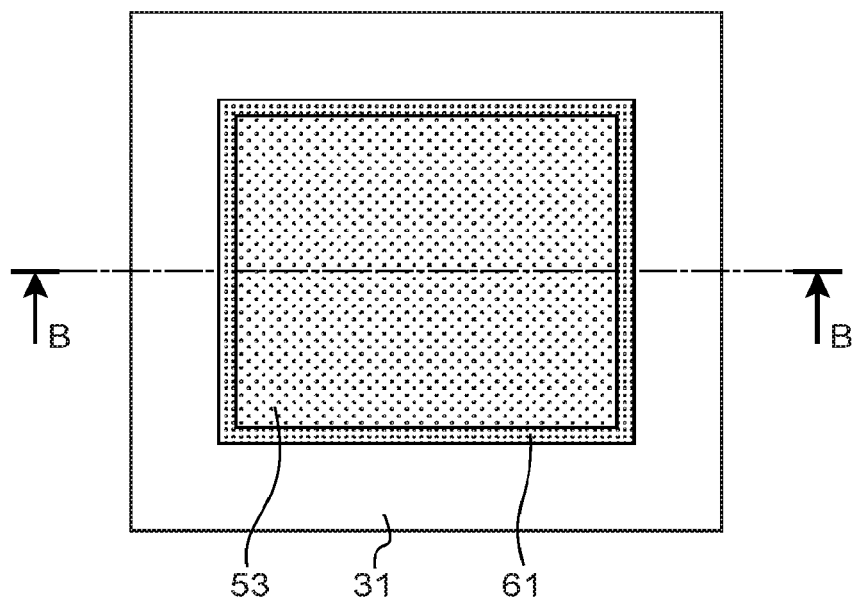
Figure 4B:
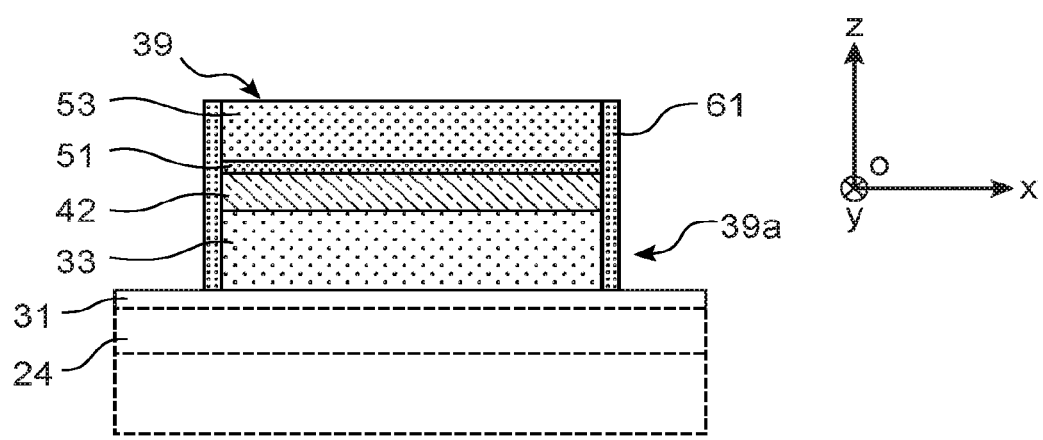
Figure 5A:
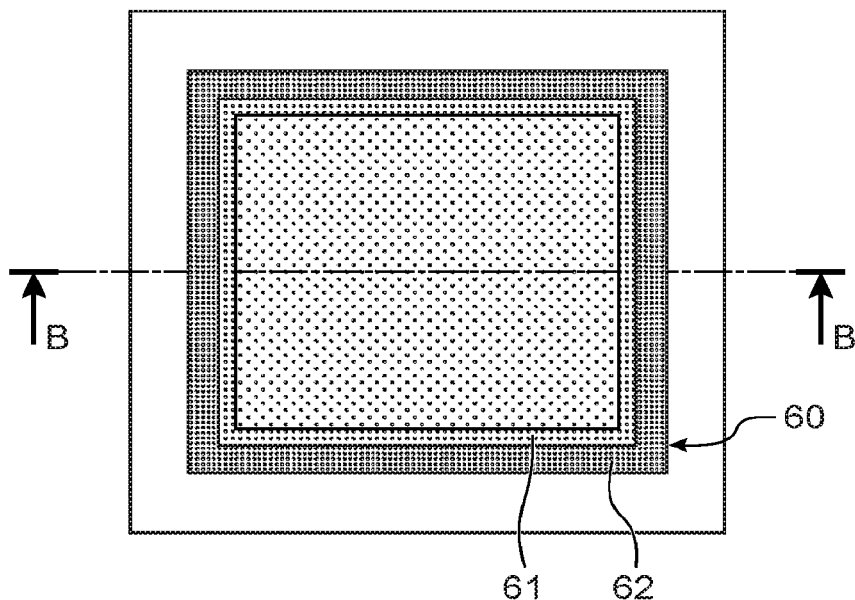
Figure 5B:
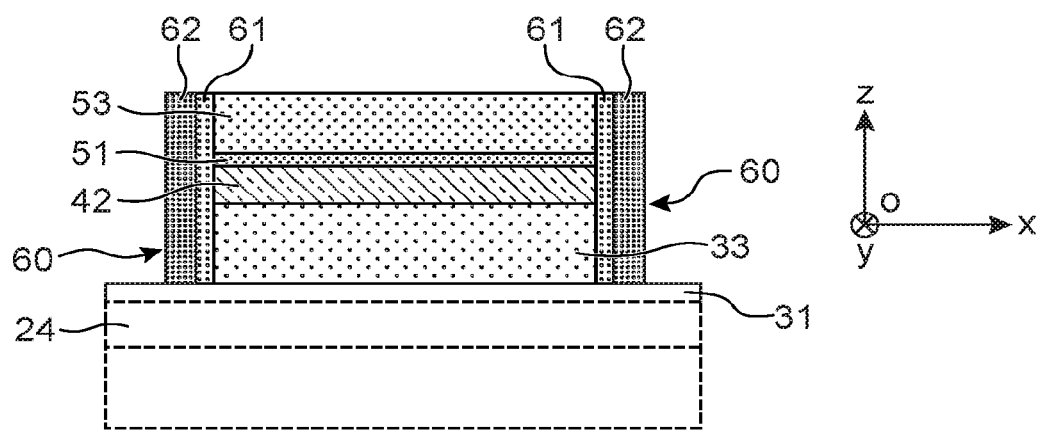

The insulating area 60 may be formed firstly by deposition and then etching of a first layer of a first dielectric material 61 (FIG. 4A showing a top view and FIG. 4B showing a sectional view along B'B) and then by deposition and etching of a second layer of a second dielectric material 62 (FIG. 5A showing a top view, FIG. 5B showing a sectional view along B'B). The second dielectric material 62 is preferably chosen so that it can be selectively etched relative to the first dielectric material 61. For example, the first dielectric material 61 may be based on silicon oxide ($SiO_2$) while the second dielectric material 62 may for example be based on silicon nitride (SiN). The first dielectric material 61 is located around and in contact with the block 39, while the second dielectric material 62 is located around and in contact with the first dielectric material 61. In this example, the lateral insulating area 60 extends vertically in contact with block 39 and faces a connection area 24 on the first level $N_1$.

The protective layer 31 may advantageously include a stack of dielectric materials similar to the stack formed from dielectric materials 61, 62, to protect the first interconnection level when forming the insulating area 60. Thus, in the case in which the first dielectric material 61 and the second dielectric material 62 are made of silicon nitride (SiN) and silicon oxide ($SiO_2$) respectively, the protective layer 31 may for example be formed from a stack of silicon oxide ($SiO_2$) with a thickness for example between 2 and 5 nm, coated with a layer of another insulating material, for example such as silicon nitride (SiN) that may for example be between 2 and 5 nm thick.

The next step is to form an encapsulation layer 71 around the lateral insulating area 60. This encapsulation layer 71 is preferably insulating and based on a material chosen to be able to resist selecting etching of the second dielectric material 62.

Figure 6A:
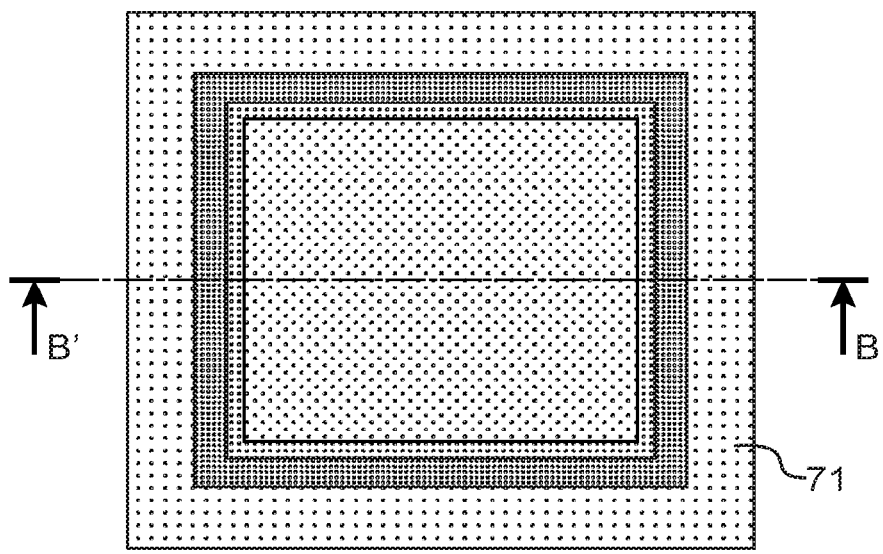
Figure 6B:
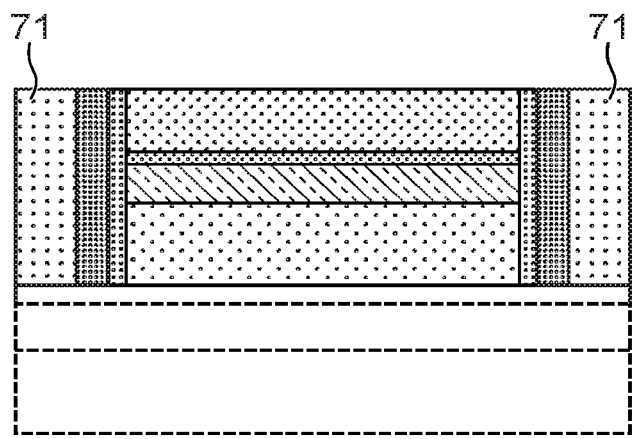

Advantageously, the encapsulation layer 71 may be based on the first dielectric material 61, for example silicon oxide ($SiO_2$). The encapsulation layer 71 may be formed by deposition and then by polishing or CMP (<<Chemical Mechanical Planarization>>), stopping on the masking layer 53 (FIGS. 6A and 6B showing a top view and a sectional view along B'B) respectively.

The next step is to define a gate location in the first masking layer 53.

This is done firstly by forming a second masking layer 83 covering the first masking layer 53, the insulating area 60 and the encapsulation layer 71. The second masking layer 83 and the first masking layer 53 may be based on the same material. Advantageously, the material used for the second masking layer 83 may also be identical to the second dielectric material 62 of the lateral insulating area 60, for example based on silicon nitride (SiN).

The next step to make the gate location is to form at least one opening 86 with the shape of a gate pattern in the second masking layer 83, and then in the first masking layer 53 (FIGS. 7A, 7B, 7C showing a top view, a sectional view along B'B and a sectional view along C'C respectively). The opening 86 may be made firstly in a resin mask 85 formed on the second masking layer 83 and then reproduced by etching in the second masking layer 83. The opening 86 is located facing at least one portion of the insulating area 60 based on the second dielectric material 62. Thus, as shown in FIG. 7C, the extension of the opening 86 may advantageously comprise or be accompanied by or be followed by the removal of a portion of the insulating area 60 exposed by the opening 86, this portion being based on the second dielectric material 62. This removal may be made by selective etching of the second dielectric material 62 relative to the first dielectric material 61. The result is that at least one first hole is formed in the insulating area 60 that extends parallel to the lateral faces of the block 39 between the encapsulation layer 71 and the first dielectric layer of the insulating area 60.

In the example embodiment shown in FIG. 7C, several first holes 87a, 87b are formed on each side of the block 39 and communicate with the opening 86 in which there is a space for a transistor gate.

When the masking layers 53, 83 are also based on the second dielectric material 62, the opening 86 and the first hole(s) 87a, 87b may be formed during the same selective etching step, for example by dry etching methods. When the bottom of the first holes 87a, 87b formed reaches the protective layer 31, the protective layer is removed so as to expose the first interconnection level on the first level $N_1$ of components, and in particular a connection area 24 belonging to this level $N_1$.

A sacrificial gate 90 can then be formed in the opening 86, for example using a Damascene type method. This sacrificial gate 90 in this case will be replaced later. The material used for the sacrificial gate 90 is preferably non-metallic and may for example be a semiconducting material, in order to limit possible contamination during subsequent steps and particularly when making the source and de drain regions by epitaxy.

Thus, after removing the resin mask 85, the opening 86 and the first holes 87a, 87b are filled with a sacrificial material 88. The sacrificial filling material 88 may for example be polysilicon. The next step may be polishing or CMP planarisation to eliminate the sacrificial material 88 that is excessive and projects beyond the outlet or the mouth of the opening 86.

Figure 8A:
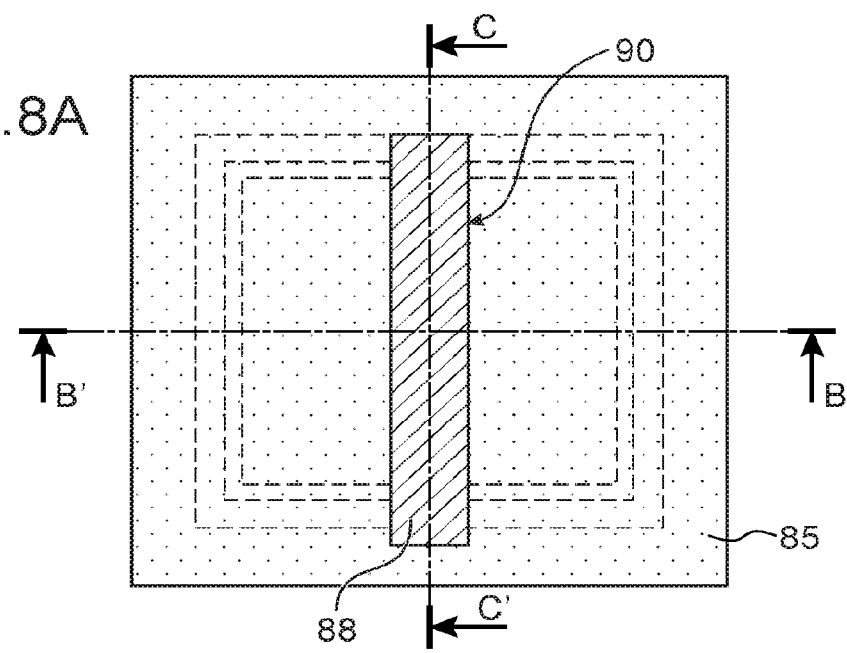
Figure 8B:
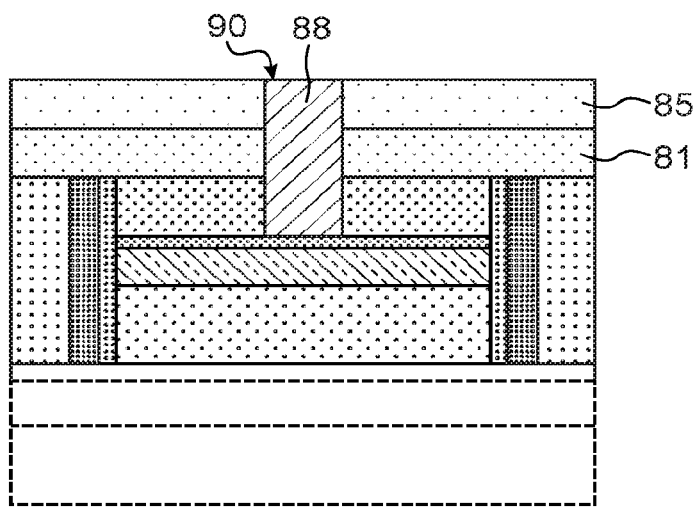
Figure 8C:
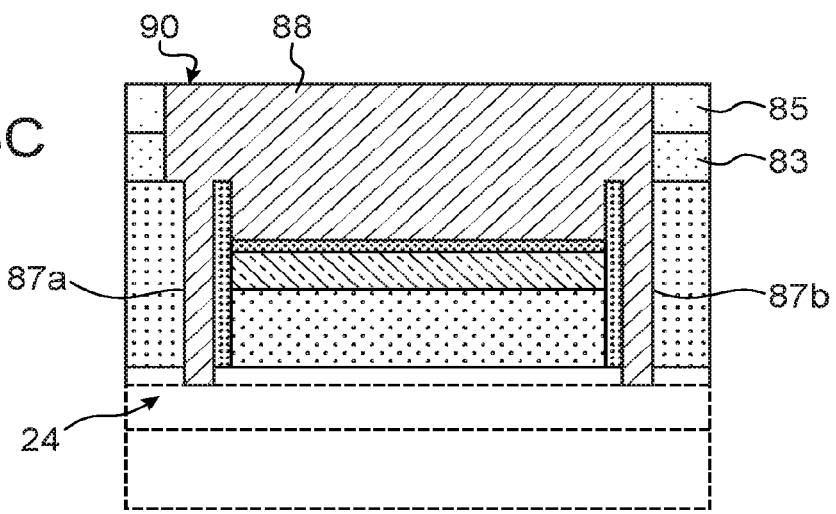

FIGS. 8A, 8B, and 8C show a top view, a sectional view along B'B, a sectional view along C'C respectively of the opening 86 and holes 87a, 87b filled with sacrificial material 88.

The next step is to remove the remaining parts of the second masking layer 83 and then the first masking layer 53.

This removal may be followed by etching of the gate dielectric layer 51 so as to form a gate dielectric area under the sacrificial gate 90.

Insulating spacers 89, for example made from silicon nitride, are then made on each side of the sacrificial gate 90 in contact with its lateral flanks.

Figure 9A:
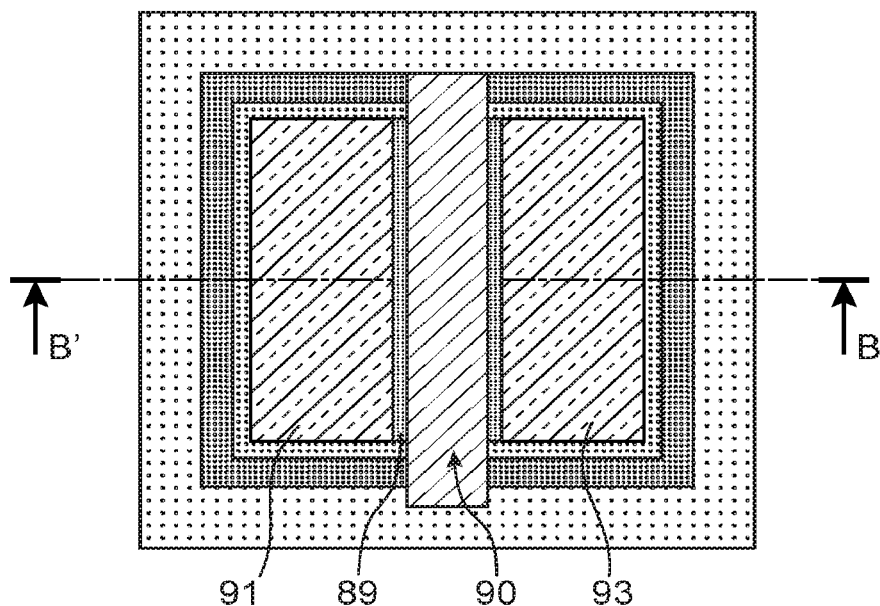
Figure 9B:
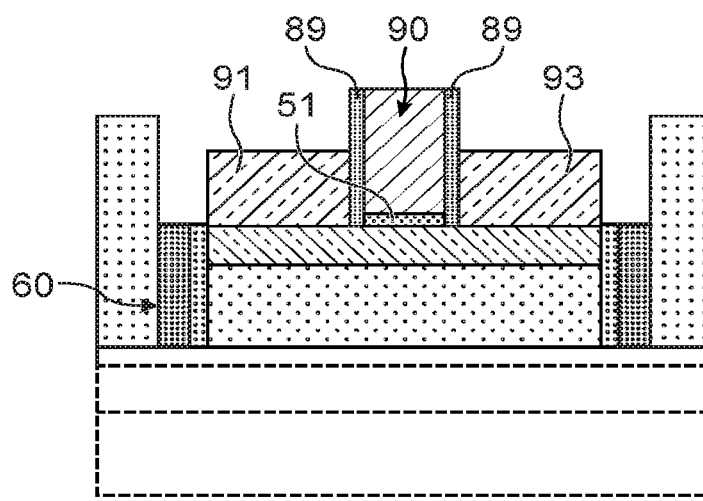

Source 91 and drain 93 semiconducting regions are then formed on each side of the sacrificial gate (FIG. 9A showing a top view, FIG. 9B showing a sectional view along B'B). The semiconducting regions 91, 93 may be made by epitaxy on the second semiconducting layer 42. The source and drain regions may also be doped.

This doping may for example be done in situ, i.e. during growth of the semiconducting material.

As a variant, the source and drain regions may be doped by implantation. FIG. 9B shows remaining portions of the insulating area 60 kept around the block.

The sacrificial gate 90 is then replaced by another gate 120.

This is done firstly by forming an insulating mask, for example based on an insulating layer 101 that may for example be based on a material identical to or similar to the first dielectric 61, for example of the FOX (<<Field OXide>>) type based on $SiO_2$. A thickness of this insulating layer 101 is then removed to expose a so-called "top" face of the sacrificial gate.

The sacrificial material 88 can then be removed from the opening 86 and the hole 87. If the sacrificial material 88 is based on polySi, removal may for example be done using dry etching methods. The insulating mask 101 protects the stack from this etching.

Figure 10A:
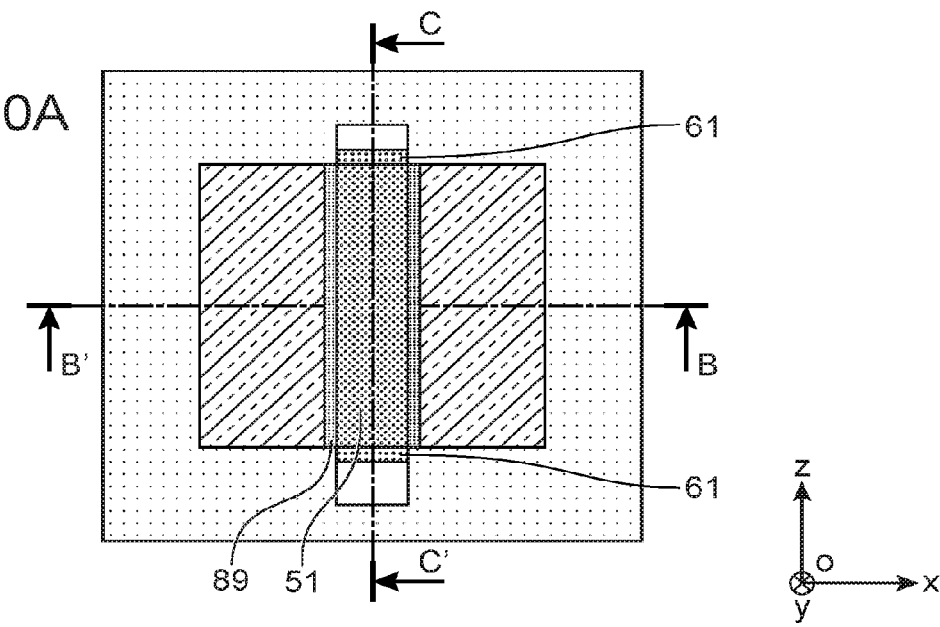
Figure 10B:
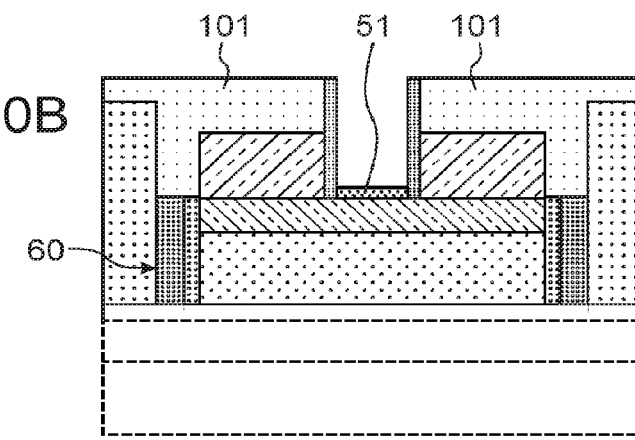
Figure 10C:
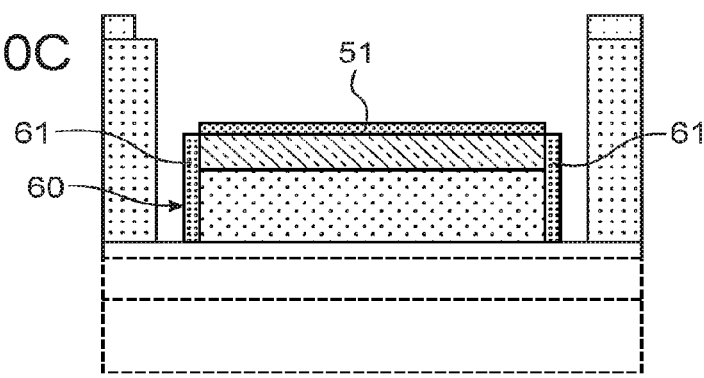

FIGS. 10A, 10B, 10C (showing a top view, a sectional view along B'B, a sectional view along C'C respectively) show the device during manufacture after removal of the sacrificial material 88. Since holes 87a, 87b have been emptied, the bottom of holes 87a, 87b once again exposes the connection area 24 again on the first level $N_1$ of components.

Figure 11A:
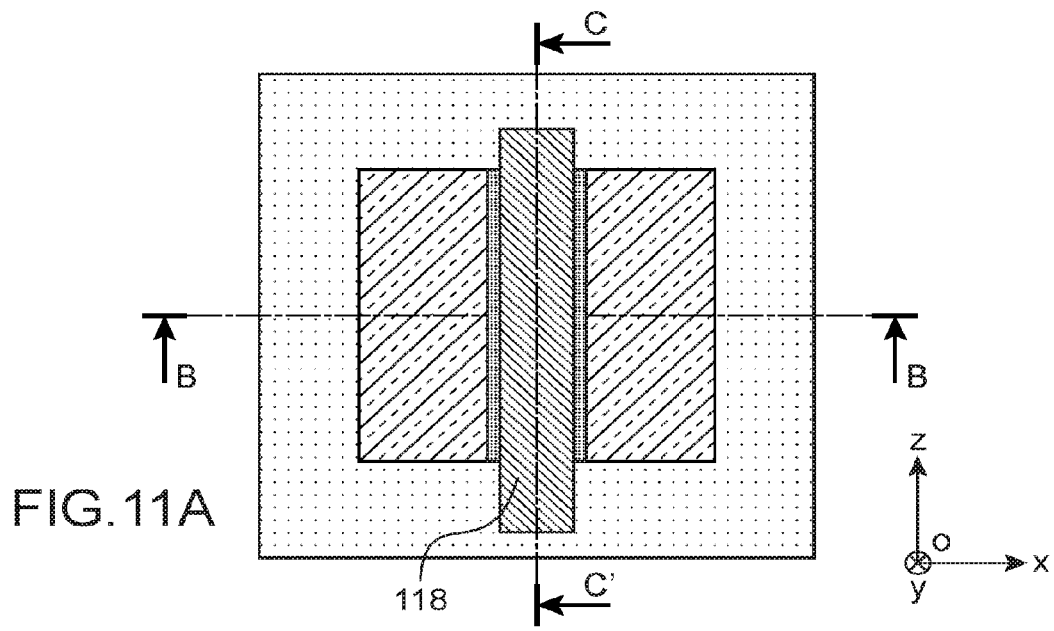
Figure 11B:
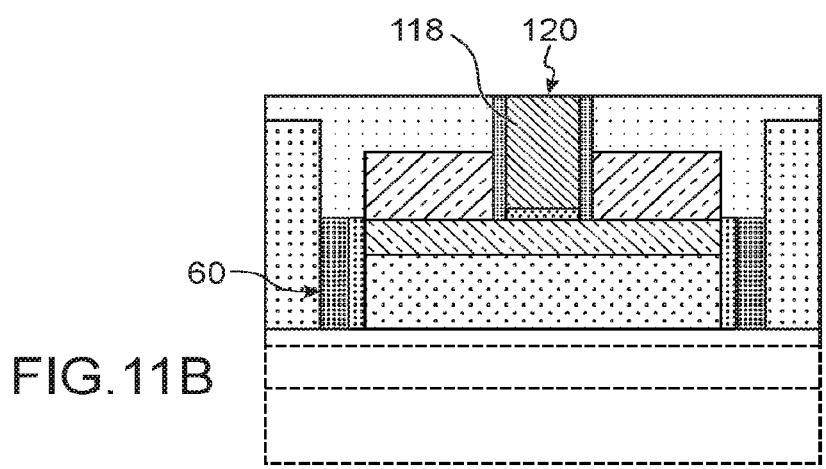
Figure 11C:
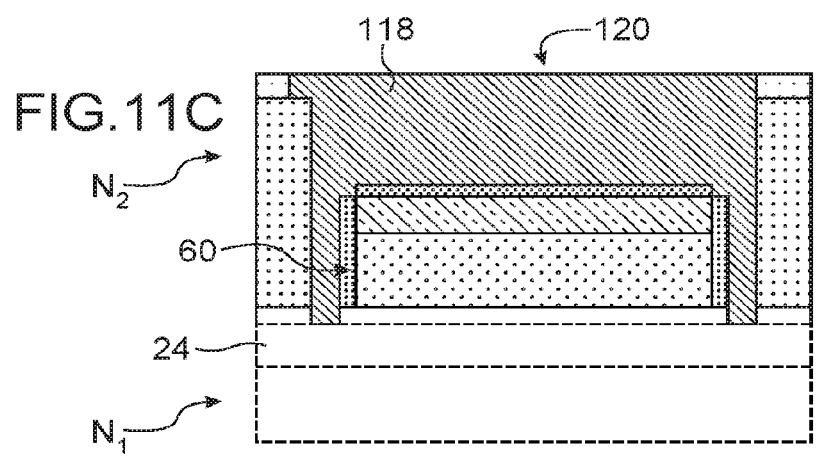
Figure 13A:
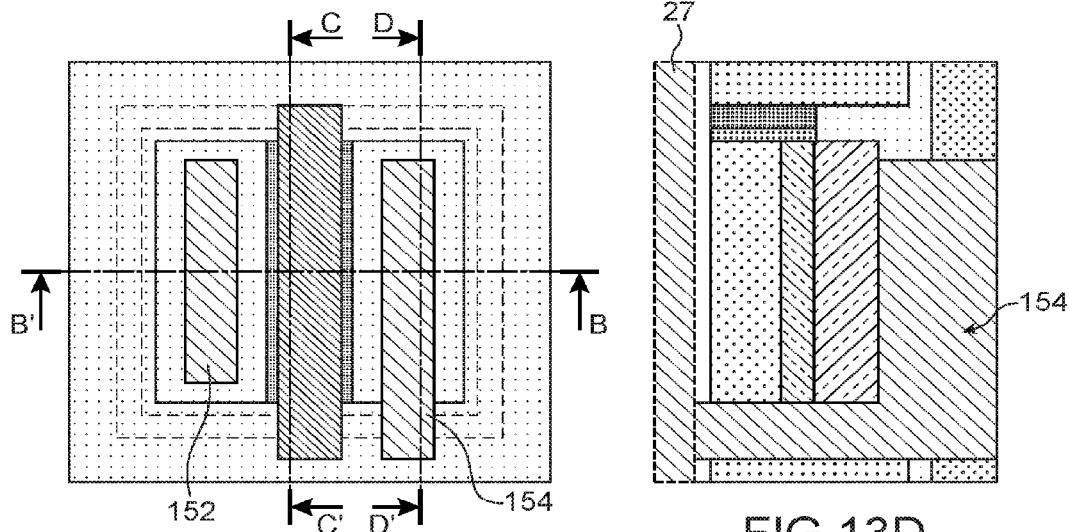
Figure 13D:
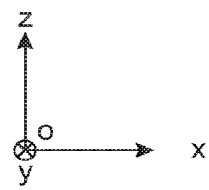
Figure 13B:
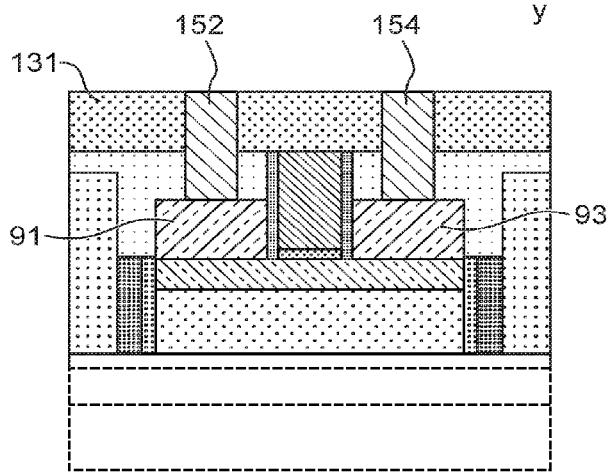
Figure 13C:
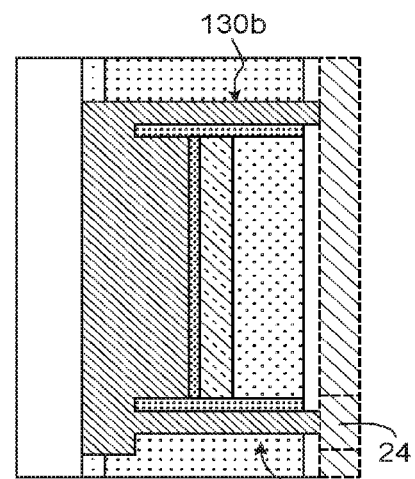

The sacrificial material 88 is then replaced by a conducting material 118, for example a metallic material such as TiN/W, or W, to form the replacement gate 120 (FIGS. 11A, 11B, 11C giving a top view, a sectional view along B'B, a sectional view along C'C respectively).

Filling holes 87a, 87b with the conducting material 118 can form first interconnection elements 130a, 130b in contact with a given connection area 24. Filling is done such that the conducting material 118 projects from holes 87a, 87b and extends onto the gate dielectric parallel to the second semiconducting layer 42 so as to form the gate 120. The result is that a contact is made between the gate of a transistor $T_{21}$ of the second level $N_2$ of components and the first interconnection level.

Other interconnection elements can then be formed, in this case between the source region 91 or the drain region 93 of the transistor $T_{21}$ of the second level $N_2$ of components and the first level $N_1$ of components.

This is done firstly by forming another insulating mask 131 for example based on $SiO_2$ through which one or several holes 147a, 147b are formed.

In the example in FIGS. 12A, 12B, 12D (showing a top view, a sectional view along B'B, a sectional view along D'D respectively), a hole 147a passes through the insulating masks 131, 101 and has a bottom exposing the semiconducting source region 91, while another hole 147b exposes the semiconducting drain region 93 of the transistor $T_{21}$ belonging to the second level $N_2$. Forming this other hole 147b includes removal of a portion of the insulating area 60 of the protective layer 31, until a connection area 27 of the first interconnection level $N_1$ is exposed. This area 27 may be distinct and may be electrically insulated from the connection area 24 to which the gate is connected through the interconnection element 130. In this example, holes 147a, 147b, formed in the insulating masks 131, 101 have different dimensions, the hole 147a extending only facing the source region, while the other longer hole 147b extends facing the drain region, and beyond the drain region also facing the connection area 27 of the first interconnection level $N_1$.

Then, the next step is to form metal and semiconductor alloy areas on the semiconducting source region 91 and drain region 93 exposed by the holes 147a, 147b. This is done by depositing a metallic material in the holes 147a, 147b, and thermal annealing is then done to silicide the semiconducting regions 91, 93.

The holes 147a, 147b are then filled with a conducting material for example such as TiN/W, W and a polishing step for example by CMP is then done (FIGS. 13A, 13B, 13C, 13D showing a top view, a sectional view along B'B, a sectional view along C'C, a sectional view along D'D respectively).

Filling holes 147a, 147b with a conducting material can form an interconnection element 152 in contact with the source region 91 and an interconnection connection element 154 in contact with the drain region 93 of the transistor $T_{21}$. Due to the configuration of the hole 147b and the fact that it projects from the drain region 93, the interconnection element 154 is also connected to the connection area 27. A contact is thus set up between the drain of transistor $T_{21}$ on the second level $N_2$ of components and the first interconnection level $N_1$.

In one variant, the interconnection element 154 can be made on the source region and the interconnection element 152 can be made on the drain region of the transistor $T_{21}$.

Figure 14:
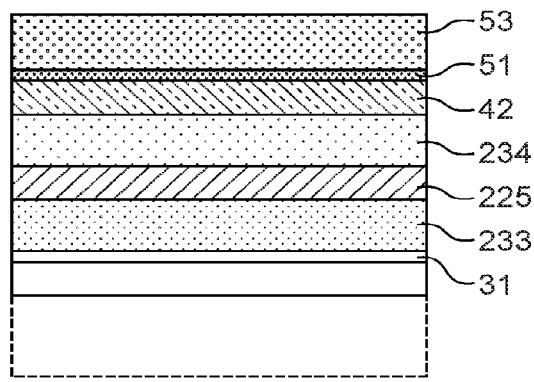
FIGS. 14, 15A-15C, 16A-16C show a variant in which there is a conducting ground plane layer or a layer to control the channel of a higher level transistor from the back.

Another variant embodiment of one of the example embodiments as disclosed above forms the stack of layers made on the first level $N_1$ with an additional conducting layer 225 that can form an electrode between the second semiconducting layer 42 and the first level $N_1$ of components (FIG. 14). This layer 225 may be based on a doped semiconducting material, for example polysilicon doped material. Doping may be done while the layer is being made or later.

Depending on the way it is biased and its doping type, this additional layer 225 can modulate the threshold voltage of one or several transistors of the second level $N_2$ of components for which the channel region is in the second semiconducting layer 42. The additional conducting layer 225 may also act as a ground plane for the transistor(s) in the second level $N_2$.

Such an additional conducting layer 225 can be made particularly when the transistor(s) in the second level $N_2$ are formed using a Fully Depleted Silicon On Insulator (SOI) type technology.

This additional conducting area 225 can be integrated by providing a stack as shown in FIG. 14 that includes an insulating layer 233 between the first level $N_1$ of components and the additional conducting layer 225, this conducting layer 225 for example possibly being based on polysilicon or metal. The insulating layer 233 may for example be based on silicon oxide and its thickness may be between 50 nm-120 nm.

Another insulating layer 234 is located on the conducting layer 225, and separates this conducting layer 225 from the second semiconducting layer 42. This other insulating layer 234 is configured particularly in terms of material, component and thickness, so as to enable capacitive coupling between the conducting layer 225 and the second semiconducting layer 42.

The other insulating layer 234 may for example be based on silicon oxide and its thickness may for example be between 10 nm and 25 nm.

Figure 15B:
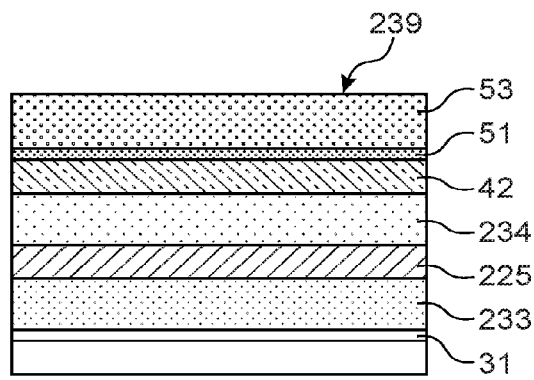
Figure 15A:
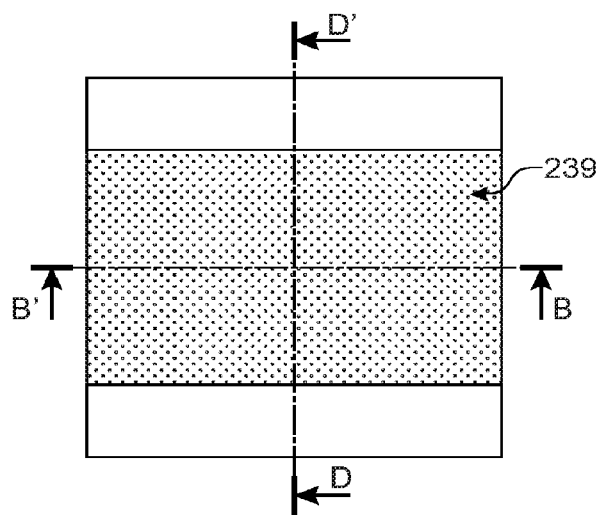
Figure 15C:
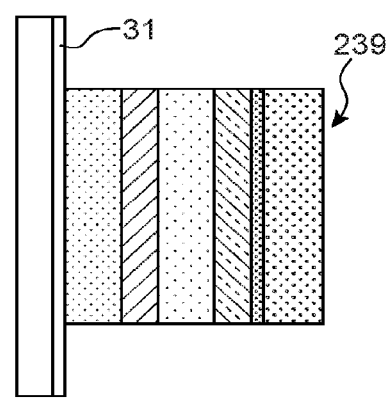

The stack made is then etched so as to define a block 239 (FIGS. 15A, 15B, 15C showing a top view, a sectional view along B'B, a sectional view along D'D respectively). This etching may for example be done by dry etching methods stopping on the protective layer 31.

Figure 16B:
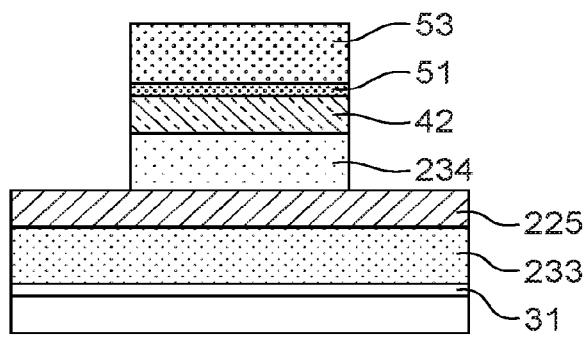
Figure 16A:
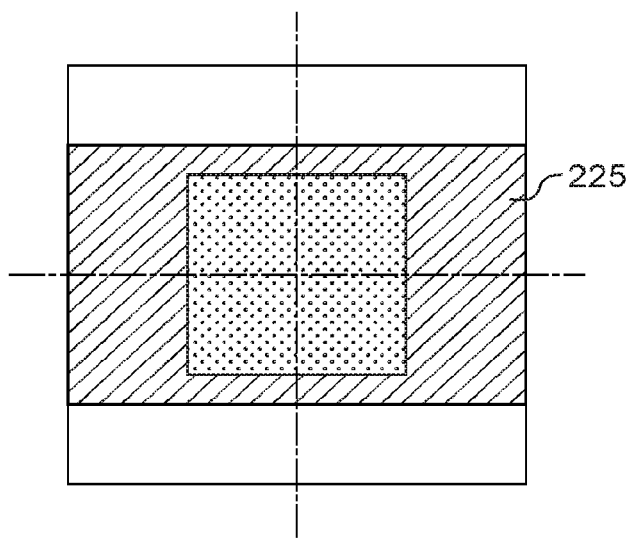
Figure 16C:
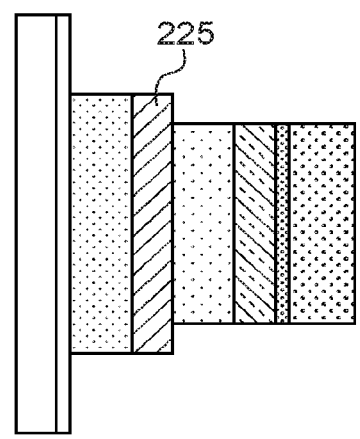

The next step is to etch the stack once again so as to define an active area in the second semiconducting layer 42 (FIGS. 16A, 16B, 16C showing a top view, a sectional view along B'B, a sectional view along D'D respectively). This new etching is done stopping on the additional conducting area 225 and is carried out so as to expose at least one region of the upper face of this conducting layer 225. In block 239, this exposed region of the conducting layer 225 projects from the second semiconducting layer, so as to form an offset. The exposed region of the conducting layer 225 is thus configured so that contact can be made on the conducting layer 225 acting as a back control or a ground plane electrode.

Steps like those described in the method disclosed above can then be performed particularly to make the lateral insulating area around the block 239, to form the first holes in the lateral insulating area and a gate location communicating with these first holes, a sacrificial gate on the second semiconducting layer 42, to form source and drain regions on the second semiconducting layer 42, and then to replace the sacrificial gate by another gate.

According to one variant embodiment of either of the examples of the method that have just been described, an insulating plug 360 can be formed in contact with the block 39, so as to cover at least one region of a lateral face of the block 39, before the lateral insulating area 60 is made. This insulating plug 360 is provided with a base made of a dielectric material different from the second dielectric material 62 from which the second dielectric layer of the insulating area 60 is formed and is capable of resisting selective etching of the second dielectric material 62 (FIGS. 17A, 17B showing a top view, a sectional view along C'C respectively of the device during its manufacturing).

The insulating plug 360 may for example be based on silicon oxide when the second dielectric material 62 is based on silicon nitride.

The lateral insulating area 60 can then be formed around the block 39 and the insulating plug 360, using steps similar to those described with reference to FIGS. 6 to 12.

In the region in which it is placed, the insulating plug 360 can prevent formation of a hole by etching a portion of the lateral insulating area 60. Thus, for a same gate pattern as in the example embodiment described above with reference to FIG. 13A, in this case a single interconnection element 130a is formed along a lateral face of the block, while preventing contact being made at a region of a lateral face covered by the insulating plug 360.

Each of the particular embodiments that have just been disclosed relates to the manufacture of interconnection elements between a first transistor level and a second transistor level, but may relate to implementation of a 3D circuit comprising more than two levels or interconnection of a transistor on a given level with other types of components on a lower level.

The invention claimed is:

1. A method for manufacturing at least one interconnection element between different component levels in an integrated circuit provided with several superposed levels of electronic components, the method comprising:
  a) forming at least one block comprising a second semiconducting layer in which at least one channel region of at least one transistor in an upper level can be at least partially formed and an insulating layer is formed between a first semiconducting layer and the second semiconducting layer on a lower level provided with one or several connection areas and at least one first component made at least partially in the first semiconducting layer;

b) forming a lateral insulating area in contact with a lateral face of the at least one block such that the lateral insulating area is supported on a first connection area on the lower level, the lateral insulating area being formed from at least one first dielectric layer based on a first dielectric material and at least one second dielectric layer based on a second dielectric material that can be selectively etched relative to the first dielectric material, the at least one first dielectric layer being placed in contact with the second semiconducting layer and being coated with the at least one second dielectric layer;

c) removing at least one portion of the lateral insulating area to form at least one hole provided with a bottom exposing said first connection area, the removed at least one portion being a portion of the second dielectric layer selectively etched relative to the first dielectric layer so as to maintain the first dielectric material between the at least one hole and the second semiconducting layer;

d) filling the at least one hole with a conducting material, the conducting material being placed so as to form at least one interconnection element between an electrode of the at least one transistor and said first connection area.

2. The method according to claim 1, wherein the electrode is a gate electrode of the at least one transistor.

3. The method according to claim 1, further comprising:
forming at least one other hole by etching at least one other portion of the lateral insulating area, the at least one other hole being arranged so as to expose an area of the second semiconducting layer designed to form a source or a drain region, and at least one second connection area on the lower level; and
filling the at least one other hole with the conducting material so as to form at least one other connection element between a source electrode or a drain electrode of the at least one transistor and a second connection area on the lower level.

4. The method according to claim 1, wherein at least one masking layer is further formed facing the second semiconducting layer and at least one opening is formed in the at least one masking layer, the at least one opening using a gate pattern, the at least one hole being made in step c) so as to communicate with the at least one opening, the deposit in step d) including filling of said at least one opening by the conducting material so as to form a transistor gate.

5. The method according to claim 4, wherein the at least one block formed in step a) comprises a gate dielectric layer located on the second semiconducting layer, the at least one opening exposing the gate dielectric layer.

6. The method according to claim 4,
wherein the lateral insulating area is composed of the at least one first dielectric layer based on the first dielectric material and the at least one second dielectric layer based on the second dielectric material, being selectively etchable relative to the first dielectric material, the at least one first dielectric layer being located in contact with the second semiconducting layer and being coated with the at least one second dielectric layer, and
wherein the at least one masking layer is in contact with the at least one second dielectric layer.

7. The method according to claim 2, further comprising, after formation of the lateral insulating area:
forming a sacrificial gate based on a sacrificial material, on the second semiconducting layer; then
growing source and drain regions on the second semiconducting layer; and then
replacing the sacrificial gate by another gate, the another gate being formed in step d) based on said conducting material.

8. The method according to claim 2, wherein the at least one block comprises a layer that forms the electrode and is located between the lower level and the second semiconducting layer, the layer that forms the electrode being configured to control a threshold voltage of said at least one transistor, depending on a bias thereof, the layer that forms the electrode being coated with the insulating layer, and being also located facing the second semiconducting layer and such that the insulating layer separates the second semiconducting layer from the layer that forms the electrode, the insulating layer having a thickness and being based on a material selected so as to enable capacitive coupling between the layer that forms the electrode and the second semiconducting layer.

9. The method according to claim 8, wherein the conducting layer projects from the second semiconducting layer in the at least one block, so as to form an offset.

10. The method according to claim 1, wherein the electrode is a source electrode or a drain electrode of the at least one transistor, the at least one portion being removed in step c) so as to expose an area of the second semiconducting layer that will form a source region or a drain region.

11. The method according to claim 1, further comprising a step, between step a) and step b), of forming an insulating plug in contact with at least one other lateral face of the at least one block, said at least one other lateral face not being covered by the insulating plug.

12. The method according to claim 1, wherein the lateral insulating area formed in step b) entirely surrounds the at least one block.

13. The method according to claim 1,
wherein the lateral insulating area is formed at least from the at least one first dielectric layer based on the first dielectric material and the at least one second dielectric layer based on the second dielectric material, being selectively etchable relative to the first dielectric material, and
wherein a protective layer is located on the lower level before the formation of the at least one block in step a), the protective layer being formed from the first dielectric material and the second dielectric material.

14. The method according to claim 1, further comprising, after step b) and before step c), forming an encapsulation layer around the lateral insulating area, the encapsulation layer being based on a material that can resist selective etching of the second dielectric material in step c).

* * * * *